US011919780B2

(12) United States Patent
Ermert et al.

(10) Patent No.: US 11,919,780 B2
(45) Date of Patent: Mar. 5, 2024

(54) OXYHALIDE PRECURSORS

(71) Applicant: ENTEGRIS, INC., Billerica, MA (US)

(72) Inventors: David M. Ermert, Danbury, CT (US); Robert L. Wright, Jr., Newtown, CT (US); Thomas H. Baum, New Fairfield, CT (US); Bryan C. Hendrix, Danbury, CT (US)

(73) Assignee: ENTEGRIS, INC., Billerica, MA (US)

(*) Notice: Subject to any disclaimer, the term of this patent is extended or adjusted under 35 U.S.C. 154(b) by 578 days.

(21) Appl. No.: 16/923,899

(22) Filed: Jul. 8, 2020

(65) Prior Publication Data

US 2021/0009437 A1    Jan. 14, 2021

Related U.S. Application Data

(60) Provisional application No. 62/871,956, filed on Jul. 9, 2019.

(51) Int. Cl.
*C01G 39/04* (2006.01)
*C01G 41/04* (2006.01)

(52) U.S. Cl.
CPC ............ *C01G 39/04* (2013.01); *C01G 41/04* (2013.01); *C01P 2002/72* (2013.01)

(58) Field of Classification Search
None
See application file for complete search history.

(56) References Cited

U.S. PATENT DOCUMENTS

| 8,962,195 | B2 | 2/2015 | Shizuka |
| 10,263,241 | B2 | 4/2019 | Small et al. |
| 2011/0305309 | A1 | 12/2011 | Brown |
| 2012/0295783 | A1 | 11/2012 | Lipke et al. |
| 2020/0208263 | A1 | 7/2020 | Tarutani et al. |

FOREIGN PATENT DOCUMENTS

| CN | 101184690 A | 5/2008 |
| EP | 2508523 B2 | 4/2019 |
| JP | 45000044 B | 1/1970 |
| WO | 2006106517 A2 | 10/2006 |
| WO | 2020084852 A1 | 4/2020 |

OTHER PUBLICATIONS

Janz, G.J., et al.; "Molten salts: vol. 4, part 2, chlorides and mixtures—electrical conductance, density, viscosity, and surface tension data"; Journal of Physical and Chemical Reference Data 4, 871, (1975).

(Continued)

*Primary Examiner* — Coris Fung
*Assistant Examiner* — Keling Zhang

(57) ABSTRACT

The invention provides a process for preparing molybdenum and tungsten oxyhalide compounds which are useful in the deposition of molybdenum and tungsten containing films on various surfaces of microelectronic devices. In the process of the invention, a molybdenum or tungsten trioxide is heated in either a solid state medium or in a melt-phase reaction comprising a eutectic blend comprising alkaline and/or alkaline earth metal salts. The molybdenum or tungsten oxyhalides thus formed may be isolated as a vapor and crystallized to provide highly pure precursor compounds such as $MoO_2Cl_2$.

3 Claims, 7 Drawing Sheets

(56) References Cited

OTHER PUBLICATIONS

Mobin, M., "High Temperature Interactions of Metal Oxides with NaCl"; Journal of Less-Common Metals, 160 (1990), pp. 1-14.

Volkovicha, V. et al.; "Behavior of molybdenum in pyrochemical reprocessing: A spectroscopic study of the chlorination of molyndenum and its oxides in chloride melts"; Journal of Nuclear Materials, 323 (2003) pp. 93-100.

Ward, B. et al.; "Synthesis and Structure of Four- and Five-Coordinated Gaseous Oxohalides of Molybdenum (VI) and Tungsten (VI)"; Inorganic Chemistry, 1968, 7, 12, pp. 2569-2573.

Atovmyan et al., Journal of Structural Chemistry., The crystal structure of MoO2C12 and W0212., vol. 9., pp. 985-986., 1968.

Popov et al., Journal of the Electrochemical Society, Electrochemical Reduction of Molybdenum(VI) Compounds in Molten Lithium Chloride-Potassium Chloride Eutectic., vol. 120., No. 10., pp. 1346-1350., 1973.

Jeyakumar et al., Application of Molybdenum(VI) Dichloride Dioxide (MoO2Cl2) in Organic Transformations, Journal of Chemical Sciences, Indian Academy of Sciences, vol. 121, No. 2, pp. 111-123, 2009.

Soleimani, Novel Route for Preparation of Molybdenum Dioxydichloridehydrate, Asian Journal of Chemistry, vol. 23, No. 4, pp. 1869-1870, 2011.

OXYHALIDE PRECURSORS

FIELD OF THE INVENTION

The present invention relates to certain precursors for the vapor deposition of certain Group VI-containing materials, a method for their preparation, and novel crystal structures thereof.

BACKGROUND OF THE INVENTION

In consequence of its characteristics of extremely high melting point, low coefficient of thermal expansion, low resistivity, and high thermal conductivity, Group VI metals such as molybdenum and tungsten are increasingly utilized in the manufacture of semiconductor devices, including use in diffusion barriers, electrodes, photomasks, power electronics substrates, low-resistivity gates, and interconnects.

Such utility has motivated efforts to achieve deposition of molybdenum and tungsten films for such applications that is characterized by high conformality of the deposited film and high deposition rate to accommodate efficient high-volume manufacturing operations. This in turn has motivated efforts to develop improved molybdenum and tungsten source reagents useful in vapor deposition operations, as well as improved process parameters utilizing such reagents.

Molybdenum pentachloride is most commonly used as a molybdenum source for chemical vapor deposition of molybdenum-containing material. Another source reagent or precursor is $MoO_2Cl_2$, but there remains a need to prepare such reagents in high yield and purity, along with other oxyhalides such as $WOCl_4$, $WO_2Cl_2$, $MoOCl_4$, and the like.

SUMMARY OF THE INVENTION

The invention provides a process for preparing certain Group VI metal oxyhalide compounds which are useful in the deposition of Group VI containing films on various surfaces of microelectronic devices. In the process of the invention, a molybdenum or tungsten trioxide is heated in either a solid state medium or in a melt-phase reaction comprising a eutectic blend comprising one or more alkaline and/or alkaline earth metal salts. The molybdenum or tungsten oxyhalide thus formed may be isolated as a vapor and crystallized to provide highly pure crystalline oxyhalides such as $MoO_2Cl_2$ and $WO_2Cl_2$ to provide another aspect of the invention.

DETAILED DESCRIPTION OF THE INVENTION

Figure 1:
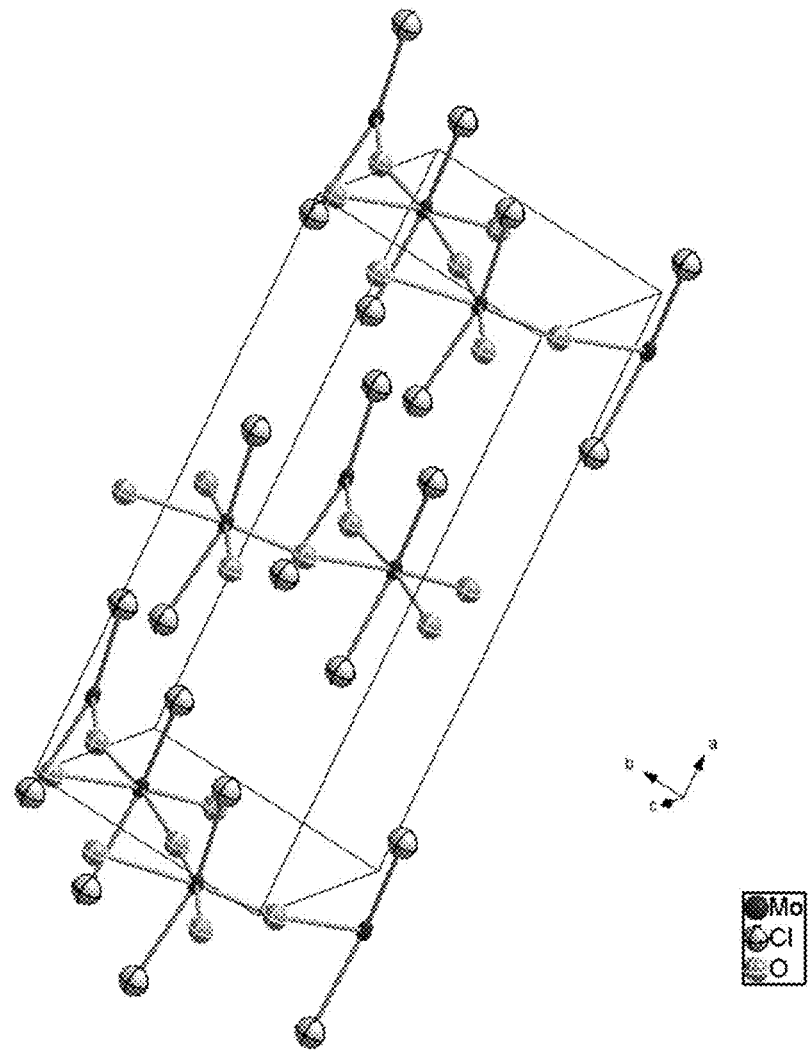
FIG. 1 is a crystal structure depiction of the $MoO_2Cl_2$ unit cell.
Figure 2:
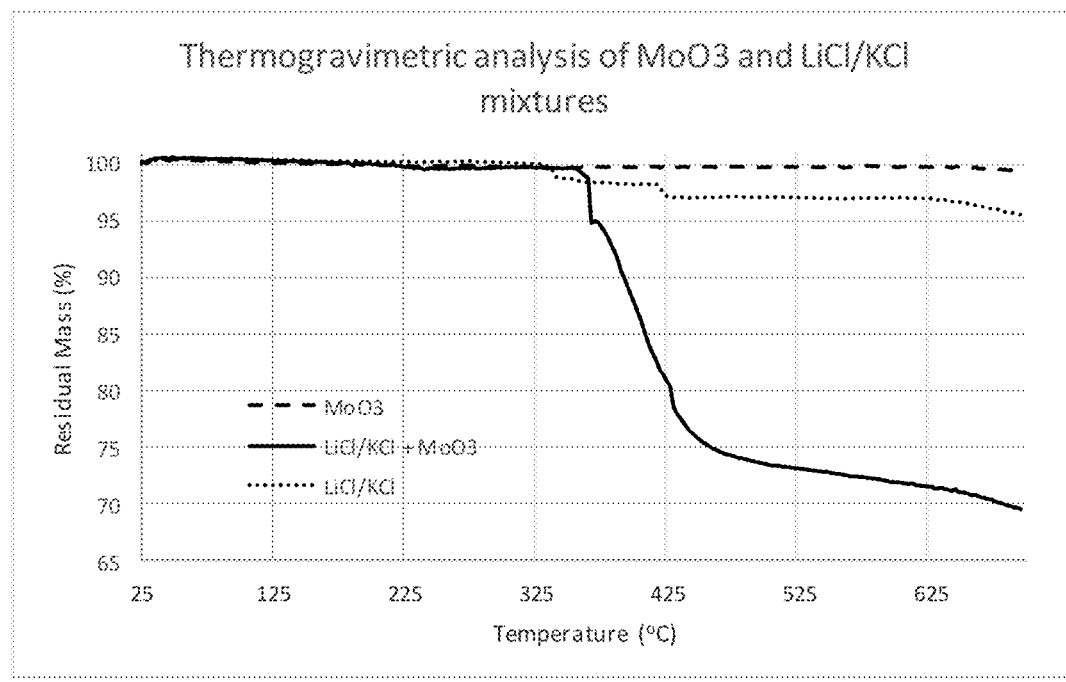
FIG. 2 depicts a thermogravimetric analysis of $MoO_3$ and LiCl/KCl mixtures displaying appreciable mass loss upon combination of $MoO_3$ and LiCl/KCl. Residual mass (%) is plotted versus Temperature (° C.)
Figure 3:
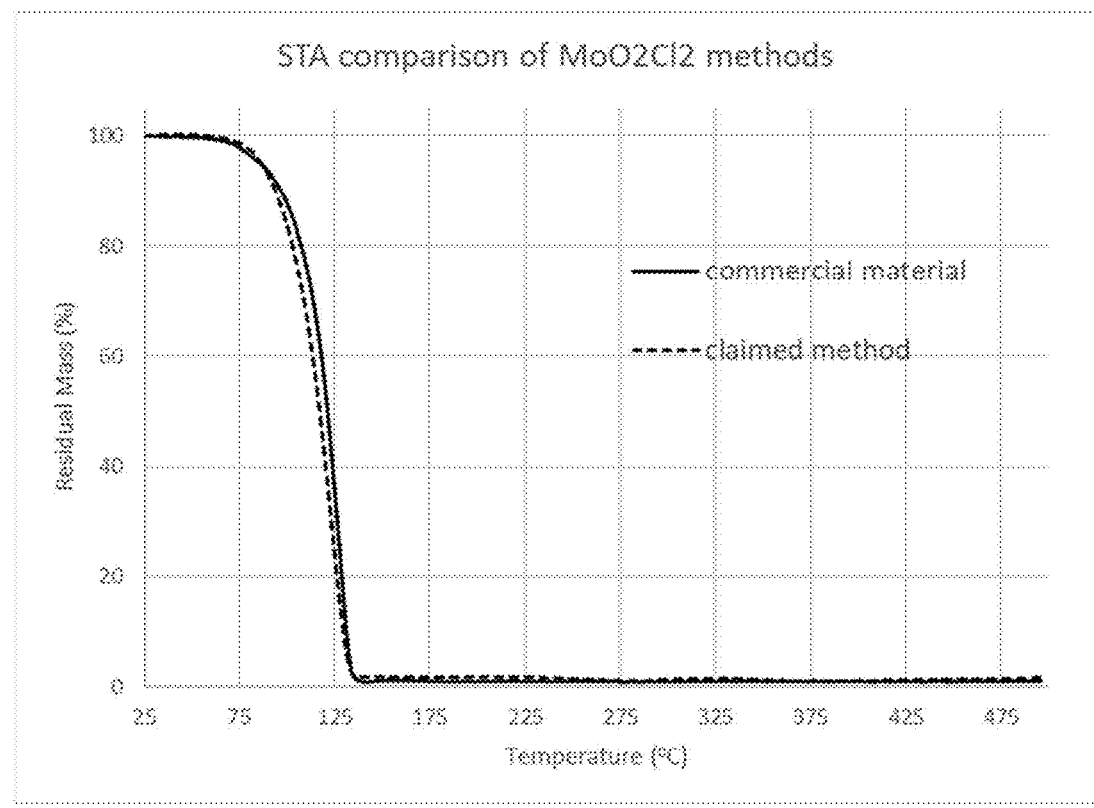
FIG. 3 depicts a thermogravimetric analysis comparing commercially available $MoO_2Cl_2$ and synthesized $MoO_2Cl_2$ using the method of the invention. Residual mass (%) is plotted versus Temperature (° C.).
Figure 4:
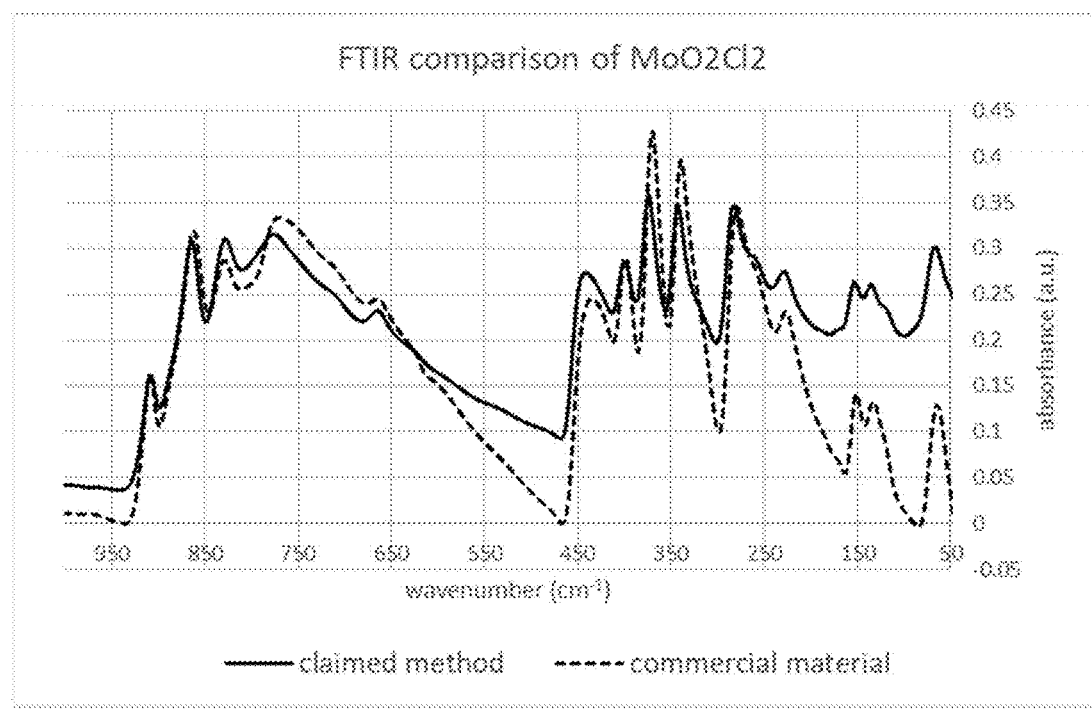
FIG. 4 is an FTIR comparison of purchased $MoO_2Cl_2$ versus $MoO_2Cl_2$ prepared using the method of the invention.

In a first aspect, the invention provides a process for preparing compounds of the formula $MO_yX_z$, wherein M is chosen from molybdenum, and tungsten, and X is chosen from chloro, fluoro, bromo, and iodo, y is 1 or 2, and z is 2 or 4, which comprises contacting a compound of the formula

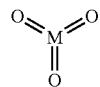

with at least one compound of the formula A-X, wherein A is chosen from elements of Group 1, Group 2, transitions metals, and main-group elements of the Periodic Table, at a temperature of about 200° to about 900° C.

As set forth herein, A can be any element capable of forming a halide.

In one embodiment, A is chosen from alkali and alkaline earth metals.

In one embodiment, A is chosen from lithium, sodium, and potassium. In another embodiment, A is chosen from magnesium, calcium, strontium, barium, beryllium, scandium, titanium, vanadium, and chromium. In another embodiment, A is lithium or potassium.

In one embodiment, X is chloro.

In another embodiment, the at least one compound of the formula A-X is a mixture of two or more compounds, and in certain embodiments, said compounds are chosen so as to form a eutectic mixture.

In the process of the invention, while the interaction of the compound of the formula A-X and the compound of the formula $MO_3$ can occur while A-X is in a solid state throughout the temperature range of about 200° to about 900°, the compounds of the formula A-X can also be advantageously chosen from those alkali metal halides and alkaline earth metal halides which form eutectic blends. In this manner, eutectic blends of two or more compounds of the formula A-X allow for the practice of the process of the invention in the melt phase at processing temperatures lower than the melting point of each individual alkali metal halide or alkaline earth metal halide, while at the same time providing a melt phase reaction environment which facilitates the sublimation of the compounds of the formula $MO_yX_z$ as formed, which can then be removed and allowed to cool to provide a pure crystalline form. Various blends of compounds of the formula A-X may be chosen and in varying proportions in order to provide a suitable reaction medium and halide source while providing at the same time a sufficiently high temperature melt phase to facilitate sublimation of the desired product as it is formed. In certain embodiments, the proportions of the individual alkali metal halides and alkaline earth metal halides may be approximately 1:1, but may also be varied from 10:1 or 1:10, depending on whatever concentration of either component of the blend is necessary to provide a melt phase reaction medium in the desired temperature range. In other embodiments, the mixture defined by the formula A-X may comprise three or more species which form a eutectic blend which forms a melt phase within the desired temperature range for the formation and sublimation of the products of the formula $MO_yX_z$.

Many compounds of the formula A-X are known to form eutectic blends, for example, LiCl/KCl, as recited in the experimental section below, along with those set forth in "Molten Salts: Volume 4, Part 2 Chlorides and Mixtures—electrical conductance, density, viscosity, and surface tension data", G. J. Janz et al., Journal of Physical and Chemical Reference Data 4, 871 (1975).

In one embodiment, the compounds of the formula A-X are a mixture of lithium chloride and potassium chloride, which form a eutectic mixture having a melting point of about 357° C., in proportions of about 44 weight percent of lithium chloride to about 56 weight percent of potassium chloride.

In certain embodiments, the process is conducted utilizing inert carrier gasses such as nitrogen, argon, etc., either at atmospheric pressure or under reduced pressure, such parameters chosen to facilitate the sublimation of the desired reaction products of the formula $MO_yX_z$, as well as to minimize thermal decomposition of the desired product. Additionally, in one embodiment, the stoichiometric amount of the starting material of the formula $MO_3$ is chosen so as to lead to a higher production of compounds of the formula $MO_yX_z$, when Y is 1 and Z is 4. In another embodiment, the stoichiometric amount of the starting material of the formula $MO_3$ is chosen so as to lead to a higher production of compounds of the formula $MO_yX_z$, when Y is 2 and Z is 2. In a further embodiment, the process is conducted under a regime of fractional sublimation, while varying the pressure and temperature so as to generate a given species at different pressure/temperature combinations. In this manner, species of desired product where Y and Z are 2 can be separated from species of desired product where Y is 1 and Z is 4, each forming a pure crystalline form upon cooling.

In a second aspect, the invention provides compounds having the formula $MO_yX_z$ in crystalline form, wherein M is chosen from molybdenum and tungsten, X is chosen from chloro, fluoro, bromo, and iodo, and y is 1 or 2, and z is 2 or 4.

In one embodiment, the compound of the formula $MO_yX_z$ is $MoO_2Cl_2$. In another embodiment, the crystalline form of the compound of the formula $MoO_2Cl_2$ possesses a crystal structure as depicted in FIG. 1; this crystalline form of $MoO_2Cl_2$ is anhydrous. In another embodiment, the crystalline form of the compound of the formula $MoO_2Cl_2$ possesses an orthorhombic crystal system, and unit cell dimensions of about
a=13.552(5) Å α=90°
b=5.456(2) Å β=90°
c=5.508(2) Å γ=90°.

The approximate bond lengths in the crystalline form of the compound of the formula $MoO_2Cl_2$ have been determined to be as follows:
Mo—Cl 2.278(2) Å
Mo—O 1.706(5)-2.239(5) Å
Cl—Mo—Cl 151.78(7) Å
O—Mo—O 79.08-102.90 Å.

As used herein the term "unit cell" refers to the smallest and simplest volume element of a crystal that is completely representative of the unit of pattern of the crystal. The dimensions of the unit cell are defined by six numbers: dimensions a, b, and c and angles α, β, and γ. A crystal is an efficiently packed array of many unit cells.

As used herein, the term "orthorhombic unit cell" refers to a unit cell wherein a≠b≠c; α=β=γ=90°.

As used herein, "crystal lattice" refers to the array of points defined by the vertices of packed unit cells, as determined by single-crystal x-ray diffraction analysis.

As used herein, "space group" refers to the symmetry of a unit cell. In a space group designation (e.g., C2) the capital letter indicates the lattice type and the other symbols represent symmetry operations that can be carried out on the unit cell without changing its appearance.

Figure 5:
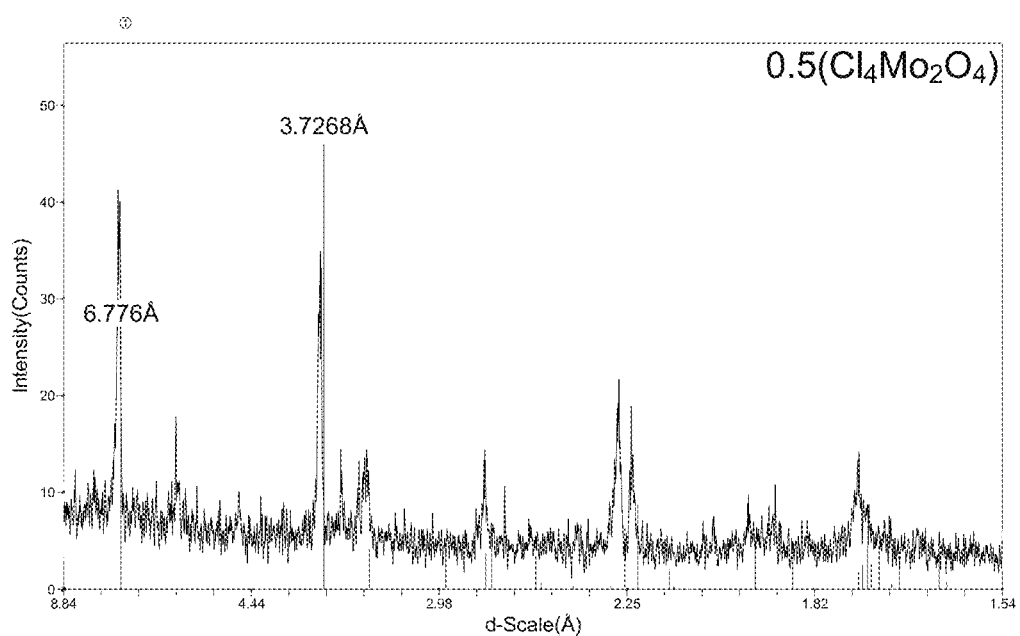
FIG. 5 is a plot of the experimental X-ray powder diffraction of $MoO_2Cl_2$ crystals compared to the calculated spectra (black lines) using the obtained $MoO_2Cl_2$ unit cell parameters.
Figure 6:
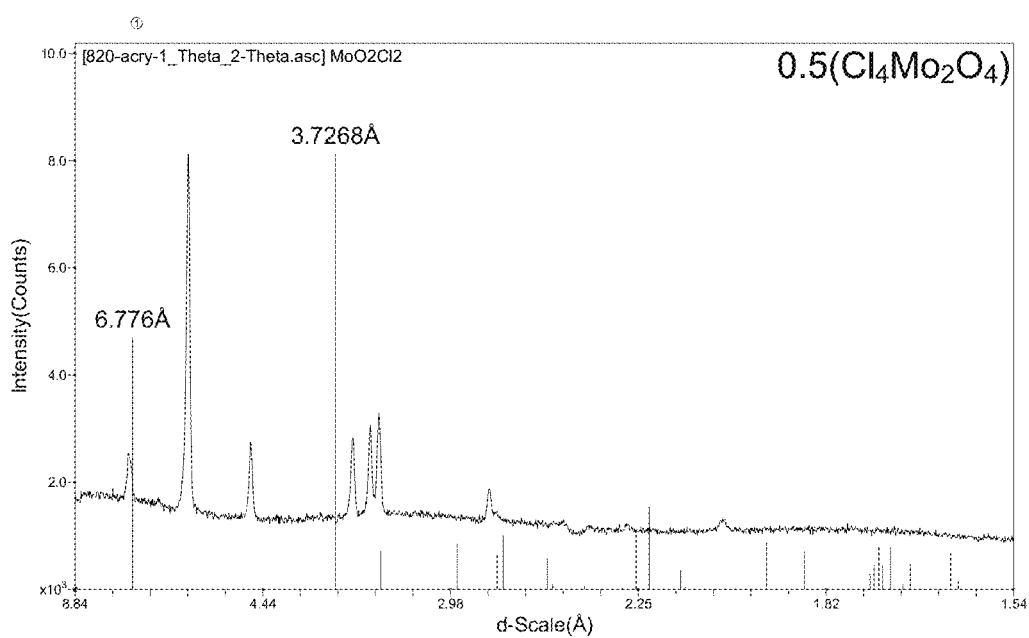
FIG. 6 is the X-ray powder diffraction of hydrated $MoO_2Cl_2$ with the simulated $MoO_2Cl_2$ illustrated below as solid vertical lines.
Figure 7:
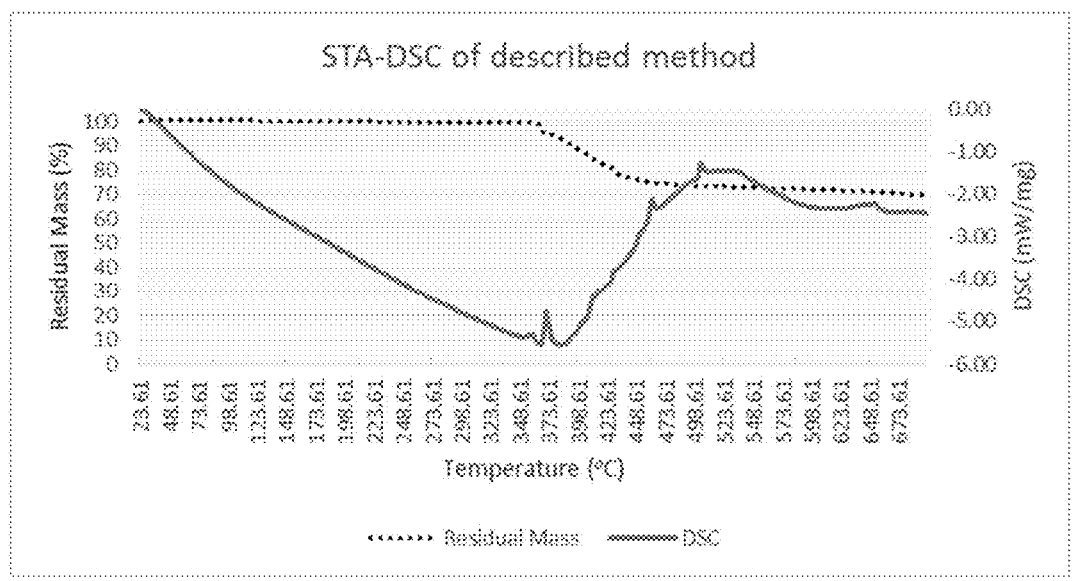
FIG. 7 is a simultaneous thermogravimetric analysis coupled with differential scanning calorimetry (STA-DSC) of the described method. This data shows that a melting point occurs at a temperature slightly different than at the LiCl/KCl eutectic alone.

In another embodiment, the crystalline form of $MoO_2Cl_2$ exhibits a powder XRD pattern with one or more peaks at 12.94, 23.64, 26.10, 39.50, and/or 40.28±0.04 degrees 2-theta. In a further embodiment, the crystalline form of $MoO_2Cl_2$ has a powder XRD pattern as depicted in FIG. 5. In another embodiment, crystalline $MoO_2Cl_2$ has a powder XRD pattern with one or more peaks as determined from the single crystal unit cell parameters listed in Table 4.

In another embodiment, the compound of the formula $MO_yX_z$ in crystalline form is $WO_2Cl_2$.

This invention can be further illustrated by the following examples of certain embodiments thereof, although it will be understood that these examples are included merely for purposes of illustration and are not intended to limit the scope of the invention unless otherwise specifically indicated.

EXAMPLES

Example 1. Synthesis of $MoO_2Cl_2$

A (44/56 by weight) mixture of lithium chloride and potassium chloride was combined with $MO_3$ in a stainless steel ampule and evacuated under reduced pressure (20 mTorr). The ampule was heated to 475° C. inside a tube furnace. The resulting $MoO_2Cl_2$ vapor was collected via a short-path tube equipped with a round bottom flask. FTIR and STA analysis supports the synthesis of $MoO_2Cl_2$.

TABLE 1

4 (ICP-MS data on $MoO_2Cl_2$ synthesized using the described method. Data reported in parts-per-million (ppm)).

| Element list | D.L. | Sample A* | Sample B | Sample C |
|---|---|---|---|---|
| Aluminum | 0.041 | 0.523 | 0.354 | 0.571 |
| Antimony | 0.027 | 0.786 | 0.690 | 0.606 |
| Barium | 0.018 | 0.019 | <0.018 | <0.018 |
| Calcium | 1.851 | 1.851 | 1.272 | 0.919 |
| Chromium | 0.027 | <0.027 | <0.027 | <0.027 |
| Cobalt | 0.026 | <0.026 | <0.026 | <0.026 |
| Copper | 0.028 | <0.028 | <0.028 | <0.028 |
| Iron | 0.028 | 0.482 | 0.404 | 0.704 |
| Lead | 0.023 | <0.023 | <0.023 | <0.023 |
| Lithium | 0.036 | 0.238 | 0.067 | 0.133 |
| Magnesium | 0.032 | 0.081 | 0.065 | 0.092 |
| Manganese | 0.021 | <0.021 | <0.021 | <0.021 |
| Nickel | 0.022 | 0.033 | 0.056 | 0.045 |
| Potassium | 0.019 | 1.019 | 2.259 | 2.731 |
| Silver | 0.027 | <0.027 | <0.027 | <0.027 |
| Sodium | 0.066 | 0.083 | 0.165 | 0.329 |
| Tin | 0.043 | 0.115 | 0.119 | 0.409 |
| Titanium | 0.067 | <0.067 | <0.067 | 0.068 |
| Vanadium | 0.027 | <0.027 | <0.027 | <0.027 |

*Each of samples A, B, and C were taken from the same lot.

TABLE 2

Crystal data and structure refinement for $MoO_2Cl_2$

| | |
|---|---|
| Identification code | NB00657 |
| Empirical formula | $Cl_2$ Mo $O_2$ |
| Formula weight | 198.84 |
| Temperature | 100.0 K |
| Wavelength | 0.71073 Å |
| Crystal system | Orthorhombic |
| Space group | $Cmc2_1$ |
| Unit cell dimensions | a = 13.552(5) Å α = 90°. |
| | b = 5.456(2) Å β = 90°. |
| | c = 5.508(2) Å γ = 90°. |
| Volume | 407.2(3) Å$^3$ |
| Z | 4 |
| Density (calculated) | 3.243 Mg/m3 |
| Absorption coefficient | 4.342 mm−1 |
| F(000) | 368 |
| Crystal size | 0.27 × 0.22 × 0.2 mm3 |
| Theta range for data collection | 3.006 to 28.284°. |
| Index ranges | −17 <= h <= 17, −7 <= k <= 5, −7 <= l <= 7 |
| Reflections collected | 1579 |
| Independent reflections | 523 [R(int) = 0.0274] |
| Completeness to theta = 25.500° | 100.0% |
| Absorption correction | Semi-empirical from equivalents |
| Max. and min. transmission | 0.2627 and 0.1831 |
| Refinement method | Full-matrix least-squares on F2 |
| Data/restraints/parameters | 523/1/28 |
| Goodness-of-fit on $F^2$ | 1.144 |
| Final R indices [I > 2sigma(I)] | R1 = 0.0216, wR2 = 0.0540 |
| R indices (all data) | R1 = 0.0234, wR2 = 0.0556 |
| Absolute structure parameter | 0.12(5) |

TABLE 2-continued

Crystal data and structure refinement for $MoO_2Cl_2$

| | |
|---|---|
| Extinction coefficient | n/a |
| Largest diff. peak and hole | 1.383 and −0.853 e. Å−3 |

TABLE 3

Bond lengths [Å] and angles [°] for $MoO_2Cl_2$.

| | |
|---|---|
| Mo(1)—Cl(1)#1 | 2.2783 (17) |
| Mo(1)—Cl(1) | 2.2783 (17) |
| Mo(1)—O(1) | 1.715 (5) |
| Mo(1)—O(1)#2 | 2.234 (6) |
| Mo(1)—O(2) | 1.706 (5) |
| Mo(1)—O(2)#3 | 2.239 (5) |
| Cl(1)#1—Mo(1)—Cl(1) | 151.78 (7) |
| O(1)#2—Mo(1)—Cl(1) | 79.41 (4) |
| O(1)—Mo(1)—Cl(1)#1 | 98.91 (5) |
| O(1)—Mo(1)—Cl(1) | 98.91 (5) |
| O(1)#2—Mo(1)—Cl(1)#1 | 79.41 (4) |
| O(1)—Mo(1)—O(1)#2 | 88.36 (11) |
| O(1)#2—Mo(1)—O(2)#3 | 79.1 (3) |
| O(1)—Mo(1)—O(2)#3 | 167.4 (3) |
| O(2)—Mo(1)—Cl(1)#1 | 98.54 (5) |
| O(2)#3—Mo(1)—Cl(1) | 78.92 (4) |
| O(2)#3—Mo(1)—Cl(1)#1 | 78.92 (4) |
| O(2)—Mo(1)—Cl(1) | 98.54 (5) |
| O(2)—Mo(1)—O(1) | 103.0 (4) |
| O(2)—Mo(1)—O(1)#2 | 168.6 (3) |
| O(2)—Mo(1)—O(2)#3 | 89.57 (6) |
| Mo(1)—O(1)—Mo(1)#4 | 149.9 (4) |
| Mo(1)—O(2)—Mo(1)#5 | 173.8 (4) |

Symmetry transformations used to generate equivalent atoms: #1 −x + 1, y, z #2 −x + 1, −y + 1, z + 1/2 #3 −x + 1, −y, z + 1/2 #4 −x + 1, −y + 1, z − 1/2 #5 −x + 1, −y, z − 1/2

TABLE 4

| 0.5($Cl_4$ $Mo_2$ $O_4$) $MoO_2Cl_2$.cif | $MoO_2Cl_2$ |
|---|---|
| 0.5(Cl4Mo2O4) | Orthorhombic: Cmc21 (36) |
| | [M = 8] |
| CELL: 13.552 × 5.456 × 5.508 <90.0 × 90.0 × 90.0> | oC20 |
| Vol = 407.3, Z = 4, Dx = 3.2428, I/Ic = 8.14 | |

See Dolomanov, O. V., Bourhis, L. J., Gildea, R. J, Howard, J. A. K. & Puschmann, H. (2009), J. Appl. Cryst. 42, 339-341. Sheldrick, G. M. (2008). Acta Cryst. A64, 112-122.
_cell_measurement_reflns_used = 1075, _cell_measurement_temperature = 100(2), _cell_measurement_theta_max = 28.28, _cell_measurement_theta_min = 3.01

99 Merged Lines in 0.0-90.0 degs >= 0.0%, I/Ic = 8.14 (m = merged line): [Diffractometer LP] [U(i, j)] [F' + F"]

| # | (hkl) | 2-Theta | d(Å) | I(f) | Theta | 1/(2d) | 2pi/d m |
|---|---|---|---|---|---|---|---|
| 1 | (200) | 13.055 | 6.776 | 57.9 | 6.527 | 0.0738 | 0.9273 |
| 2 | (110) | 17.508 | 5.0612 | 0.1 | 8.754 | 0.0988 | 1.2414 |
| 3 | (111) | 23.857 | 3.7268 | 100.0 | 11.929 | 0.1342 | 1.6860 |
| 4 | (310) | 25.580 | 3.4795 | 0.3 | 12.790 | 0.1437 | 1.8058 |
| 5 | (400) | 26.283 | 3.3880 | 8.8 | 13.142 | 0.1476 | 1.8545 |
| 6 | (311) | 30.360 | 2.9417 | 10.5 | 15.180 | 0.1700 | 2.1359 |
| 7 | (2) | 32.485 | 2.7540 | 8.0 | 16.242 | 0.1816 | 2.2815 |
| 8 | (20) | 32.803 | 2.7280 | 12.3 | 16.401 | 0.1833 | 2.3032 |
| 9 | (202) | 35.146 | 2.5513 | 7.3 | 17.573 | 0.1960 | 2.4627 |
| 10 | (220) | 35.443 | 2.5306 | 1.3 | 17.722 | 0.1976 | 2.4829 |
| 11 | (21) | 36.734 | 2.4446 | 0.1 | 18.367 | 0.2045 | 2.5702 |
| 12 | (510) | 37.004 | 2.4274 | 0.0 | 18.502 | 0.2060 | 2.5885 |
| 13 | (112) | 37.136 | 2.4191 | 0.7 | 18.568 | 0.2067 | 2.5974 |
| 14 | (221) | 39.143 | 2.2995 | 0.5 | 19.571 | 0.2174 | 2.7324 |
| 15 | (600) | 39.880 | 2.2587 | 13.5 | 19.940 | 0.2214 | 2.7818 |
| 16 | (511) | 40.582 | 2.2212 | 19.0 | 20.291 | 0.2251 | 2.8287 |
| 17 | (312) | 41.797 | 2.1594 | 0.4 | 20.898 | 0.2315 | 2.9096 |
| 18 | (402) | 42.256 | 2.1370 | 4.4 | 21.128 | 0.2340 | 2.9401 |
| 19 | (420) | 42.510 | 2.1248 | 0.6 | 21.255 | 0.2353 | 2.9571 |
| 20 | (421) | 45.730 | 1.9824 | 0.3 | 22.865 | 0.2522 | 3.1695 |
| 21 | (22) | 46.837 | 1.9381 | 10.8 | 23.419 | 0.2580 | 3.2419 |
| 22 | (222) | 48.835 | 1.8634 | 8.5 | 24.418 | 0.2683 | 3.3719 |
| 23 | (710) | 49.945 | 1.8245 | 0.0 | 24.973 | 0.2740 | 3.4437 |
| 24 | (512) | 50.049 | 1.8210 | 0.2 | 25.025 | 0.2746 | 3.4504 |

TABLE 4-continued

| No | (hkl) | | | | | | |
|---|---|---|---|---|---|---|---|
| 25 | (130) | 50.599 | 1.8025 | 0.0 | 25.299 | 0.2774 | 3.4858 |
| 26 | (602) | 52.344 | 1.7464 | 3.6 | 26.172 | 0.2863 | 3.5977 |
| 27 | (620) | 52.561 | 1.7397 | 5.5 | 26.280 | 0.2874 | 3.6116 |
| 28 | (711) | 52.814 | 1.7320 | 9.8 | 26.407 | 0.2887 | 3.6277 |
| 29 | (113) | 53.013 | 1.7259 | 5.6 | 26.507 | 0.2897 | 3.6404 |
| 30 | (131) | 53.442 | 1.7131 | 9.7 | 26.721 | 0.2919 | 3.6677 |
| 31 | (800) | 54.094 | 1.6940 | 1.3 | 27.047 | 0.2952 | 3.7091 |
| 32 | (330) | 54.334 | 1.6871 | 0.2 | 27.167 | 0.2964 | 3.7243 |
| 33 | (422) | 54.501 | 1.6823 | 5.7 | 27.250 | 0.2972 | 3.7349 |
| 34 | (621) | 55.333 | 1.6590 | 0.0 | 27.666 | 0.3014 | 3.7874 |
| 35 | (313) | 56.637 | 1.6238 | 8.1 | 28.319 | 0.3079 | 3.8694 |
| 36 | (331) | 57.048 | 1.6131 | 1.6 | 28.524 | 0.3100 | 3.8951 |
| 37 | (23) | 60.758 | 1.5232 | 0.1 | 30.379 | 0.3283 | 4.1251 |
| 38 | (712) | 60.853 | 1.5210 | 0.1 | 30.426 | 0.3287 | 4.1309 |
| 39 | (530) | 61.336 | 1.5102 | 0.0 | 30.668 | 0.3311 | 4.1605 |
| 40 | (132) | 61.426 | 1.5082 | 0.0 | 30.713 | 0.3315 | 4.1660 |
| 41 | (223) | 62.442 | 1.4861 | 0.1 | 31.221 | 0.3365 | 4.2280 |
| 42 | (622) | 63.163 | 1.4708 | 7.2 | 31.581 | 0.3399 | 4.2718 |
| 43 | (513) | 63.477 | 1.4643 | 3.0 | 31.739 | 0.3415 | 4.2909 |
| 44 | (531) | 63.861 | 1.4564 | 4.6 | 31.930 | 0.3433 | 4.3141 |
| 45 | (910) | 64.103 | 1.4515 | 0.0 | 32.052 | 0.3445 | 4.3287 |
| 46 | (802) | 64.533 | 1.4429 | 1.0 | 32.266 | 0.3465 | 4.3546 |
| 47 | (820) | 64.723 | 1.4391 | 0.4 | 32.361 | 0.3474 | 4.3660 |
| 48 | (332) | 64.748 | 1.4386 | 0.2 | 32.374 | 0.3476 | 4.3676 |
| 49 | (911) | 66.570 | 1.4036 | 0.9 | 33.285 | 0.3562 | 4.4765 |
| 50 | (821) | 67.177 | 1.3924 | 0.1 | 33.589 | 0.3591 | 4.5126 |
| 51 | (423) | 67.350 | 1.3892 | 0.1 | 33.675 | 0.3599 | 4.5228 |
| 52 | (4) | 68.029 | 1.3770 | 0.4 | 34.014 | 0.3631 | 4.5630 |
| 53 | (40) | 68.767 | 1.3640 | 1.8 | 34.384 | 0.3666 | 4.6064 |
| 54 | (10, 0, 0) | 69.277 | 1.3552 | 0.3 | 34.639 | 0.3689 | 4.6364 |
| 55 | (204) | 69.617 | 1.3494 | 1.8 | 34.808 | 0.3705 | 4.6562 |
| 56 | (240) | 70.348 | 1.3372 | 0.8 | 35.174 | 0.3739 | 4.6988 |
| 57 | (114) | 70.864 | 1.3287 | 0.0 | 35.432 | 0.3763 | 4.7288 |
| 58 | (730) | 71.059 | 1.3255 | 0.0 | 35.529 | 0.3772 | 4.7401 |
| 59 | (532) | 71.143 | 1.3242 | 0.0 | 35.571 | 0.3776 | 4.7450 |
| 60 | (41) | 71.153 | 1.3240 | 0.1 | 35.577 | 0.3776 | 4.7456 |
| 61 | (241) | 72.711 | 1.2994 | 0.3 | 36.355 | 0.3848 | 4.8353 |
| 62 | (713) | 73.054 | 1.2942 | 1.8 | 36.527 | 0.3863 | 4.8550 |
| 63 | (731) | 73.412 | 1.2887 | 3.4 | 36.706 | 0.3880 | 4.8755 |
| 64 | (133) | 73.578 | 1.2862 | 1.6 | 36.789 | 0.3887 | 4.8849 |
| 65 | (912) | 73.723 | 1.2841 | 0.0 | 36.861 | 0.3894 | 4.8932 |
| 66 | (314) | 73.971 | 1.2804 | 0.1 | 36.986 | 0.3905 | 4.9073 |
| 67 | (404) | 74.291 | 1.2757 | 1.6 | 37.145 | 0.3920 | 4.9254 |
| 68 | (822) | 74.304 | 1.2755 | 1.9 | 37.152 | 0.3920 | 4.9262 |
| 69 | (440) | 75.003 | 1.2653 | 0.5 | 37.501 | 0.3952 | 4.9657 |
| 70 | (623) | 75.174 | 1.2628 | 0.1 | 37.587 | 0.3959 | 4.9754 |
| 71 | (333) | 76.643 | 1.2423 | 3.1 | 38.322 | 0.4025 | 5.0579 |
| 72 | (441) | 77.311 | 1.2332 | 0.2 | 38.656 | 0.4055 | 5.0951 |
| 73 | (24) | 77.603 | 1.2293 | 0.3 | 38.802 | 0.4067 | 5.1113 |
| 74 | (42) | 78.130 | 1.2223 | 1.2 | 39.065 | 0.4091 | 5.1405 |
| 75 | (10, 0, 2) | 78.616 | 1.2160 | 0.6 | 39.308 | 0.4112 | 5.1673 |
| 76 | (10, 2, 0) | 78.791 | 1.2137 | 0.1 | 39.396 | 0.4120 | 5.1769 |
| 77 | (224) | 79.115 | 1.2095 | 2.6 | 39.558 | 0.4134 | 5.1947 |
| 78 | (242) | 79.639 | 1.2029 | 1.3 | 39.820 | 0.4157 | 5.2234 |
| 79 | (11, 1, 0) | 79.730 | 1.2017 | 0.0 | 39.865 | 0.4161 | 5.2284 |
| 80 | (514) | 80.053 | 1.1977 | 0.0 | 40.027 | 0.4175 | 5.2460 |
| 81 | (732) | 80.321 | 1.1944 | 0.0 | 40.160 | 0.4186 | 5.2606 |
| 82 | (10, 2, 1) | 81.068 | 1.1853 | 0.0 | 40.534 | 0.4218 | 5.3011 |
| 83 | (604) | 81.864 | 1.1757 | 0.4 | 40.932 | 0.4253 | 5.3441 |
| 84 | (11, 1, 1) | 82.000 | 1.1741 | 1.6 | 41.000 | 0.4259 | 5.3514 |
| 85 | (640) | 82.557 | 1.1676 | 2.0 | 41.279 | 0.4282 | 5.3812 |
| 86 | (533) | 82.667 | 1.1663 | 1.1 | 41.334 | 0.4287 | 5.3871 |
| 87 | (930) | 83.233 | 1.1598 | 0.0 | 41.617 | 0.4311 | 5.4173 |
| 88 | (424) | 83.610 | 1.1556 | 2.4 | 41.805 | 0.4327 | 5.4373 |
| 89 | (442) | 84.128 | 1.1498 | 1.1 | 42.064 | 0.4349 | 5.4648 |
| 90 | (641) | 84.812 | 1.1422 | 0.1 | 42.406 | 0.4377 | 5.5008 |
| 91 | (913) | 85.141 | 1.1387 | 2.1 | 42.571 | 0.4391 | 5.5181 |
| 92 | (931) | 85.486 | 1.1349 | 0.4 | 42.743 | 0.4406 | 5.5361 |
| 93 | (823) | 85.701 | 1.1326 | 0.0 | 42.851 | 0.4414 | 5.5474 |
| 94 | (12, 0, 0) | 86.013 | 1.1293 | 0.9 | 43.006 | 0.4427 | 5.5636 |
| 95 | (10, 2, 2) | 87.827 | 1.1106 | 1.1 | 43.913 | 0.4502 | 5.6574 |
| 96 | (11, 1, 2) | 88.750 | 1.1014 | 0.0 | 44.375 | 0.4539 | 5.7045 |
| 97 | (714) | 88.988 | 1.0991 | 0.0 | 44.494 | 0.4549 | 5.7166 |
| 98 | (43) | 89.421 | 1.0949 | 0.0 | 44.710 | 0.4567 | 5.7385 |
| 99 | (134) | 89.491 | 1.0942 | 0.1 | 44.745 | 0.4569 | 5.7421 |

Table 4 is the simulated Powder X-ray Diffraction (PXRD) spectra using the unit cell ($MoO_2Cl_2$ crystal structure) using commercially-available software to model and simulate PXRD data.

TABLE 5

Hydrated $MoO_2Cl_2$ — Peak Search Report

SCAN: 10.0/90.0/0.032/43.5(sec), Cu, I(p) = 8121, 05/22/1 9 11: 28p
PEAK: 15(pts)/Parabolic Filter, Threshold = 3.0, Cutoff = 0.1%, BG = 3/10, Peak-To . . .
NOTE: Intensity = Counts, 2T(0) = 0.0(deg), Wavelength to Compute d-Spacing = . . .

| # | 2-Theta | d(Å) | BG | Height | H % | Area | A % | FWHM |
|---|---------|------|------|--------|-------|-------|-------|-------|
| 1 | 12.854 | 6.8817 | 1670 | 876 | 13.1 | 8314 | 15.6 | 0.258 |
| 2 | 16.045 | 5.5194 | 1458 | 6663 | 100.0 | 53209 | 100.0 | 0.217 |
| 3 | 19.349 | 4.5836 | 1328 | 1428 | 21.4 | 10284 | 19.3 | 0.196 |
| 4 | 24.786 | 3.5891 | 1403 | 1421 | 21.3 | 10676 | 20.1 | 0.204 |
| 5 | 25.738 | 3.4586 | 1432 | 1641 | 24.6 | 12382 | 23.3 | 0.205 |
| 6 | 26.191 | 3.3997 | 1418 | 1875 | 28.1 | 15407 | 29.0 | 0.223 |
| 7 | 32.051 | 2.7902 | 1292 | 579 | 8.7 | 5877 | 11.0 | 0.276 |
| 8 | 32.486 | 2.7539 | 1269 | 181 | 2.7 | 3136 | 5.9 | 0.472 |
| 9 | 35.509 | 2.5260 | 1159 | 112 | 1.7 | 2723 | 5.1 | 0.660 |
| 10 | 36.011 | 2.4920 | 1122 | 174 | 2.6 | 2305 | 4.3 | 0.361 |
| 11 | 44.499 | 2.0344 | 1089 | 251 | 3.8 | 3794 | 7.1 | 0.411 |

Table 5 depicts the experimental X-ray powder diffraction of hydrated $MoO_2Cl_2$ obtained after exposure of $MoO_2Cl_{12}$ to ambient atmosphere for several hours.

In the drawings and specification, there have been disclosed certain embodiments of the invention and, although specific terms are employed, they are used in a generic and descriptive sense only and not for purposes of limitation, the scope of the invention being set forth in the following claims.

The invention claimed is:

1. A compound having a formula $MoO_2Cl_2$ in crystalline form and orthorhombic crystal system and unit cell dimensions of about a=13.552 Å α=90°
b=5.456 Å β=90°
c=5.508 Å γ=90°.

2. The compound of claim 1, which exhibits a powder X-ray diffraction (XRD) pattern with one or more peaks at 12.94, 23.64, 26.10, 39.50, and/or 40.28±0.04 degrees 2-theta.

3. The compound of claim 1, which has a powder X-ray diffraction (XRD) pattern comprises peak at about 6.776Å and about 3.7268Å.

* * * * *